United States Patent
Murphy

(10) Patent No.: US 9,399,732 B2
(45) Date of Patent: Jul. 26, 2016

(54) PROCESSES FOR PREPARING COLOR STABLE MANGANESE-DOPED PHOSPHORS

(71) Applicant: GENERAL ELECTRIC COMPANY, Schenectady, NY (US)

(72) Inventor: James Edward Murphy, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 159 days.

(21) Appl. No.: 14/465,024

(22) Filed: Aug. 21, 2014

(65) Prior Publication Data
US 2015/0054400 A1 Feb. 26, 2015

Related U.S. Application Data

(60) Provisional application No. 61/868,633, filed on Aug. 22, 2013.

(51) Int. Cl.
*C09K 11/61* (2006.01)
*C09K 11/64* (2006.01)
(Continued)

(52) U.S. Cl.
CPC ............. *C09K 11/675* (2013.01); *C09K 11/617* (2013.01); *F21V 9/16* (2013.01); *H01L 33/502* (2013.01)

(58) Field of Classification Search
CPC .. C09K 11/616; C09K 11/617; C09K 11/675; C09K 11/628; C09K 11/645; C09K 11/665; C09K 11/0838; C09K 11/02; C09K 11/664; C09K 2211/181; C09K 2211/188; H01L 33/502; H01L 33/504; H01L 33/507; H01L 33/52; H05B 33/14; Y02B 20/181; Y10T 428/299

USPC ....... 252/301.4 F, 301.4 H, 301.4 R, 301.6 F; 313/486, 503; 362/84, 97.1; 428/403; 257/98

See application file for complete search history.

(56) References Cited

U.S. PATENT DOCUMENTS

| 2,522,074 A | 9/1950 | Urbach |
| 3,576,756 A | 4/1971 | Russo |

(Continued)

FOREIGN PATENT DOCUMENTS

| CN | 102827601 A | 12/2012 |
| CN | 102851026 A | 1/2013 |

(Continued)

OTHER PUBLICATIONS

Arai et al., "Mn-activated Na2SiF6 red and yellowish-green phosphors: A comparative study", Sep. 22, 2011, Journal of Applied Physics, 110, pp. 063514-1 to 063514-9.*

(Continued)

*Primary Examiner* — Jonathan Johnson
*Assistant Examiner* — Lynne Edmondson
(74) *Attorney, Agent, or Firm* — Mary Louise Stanford

(57) ABSTRACT

Low-HF or HF-free processes for improving color stability of a $Mn^{+4}$ doped phosphor of formula I include contacting the phosphor of formula I with a solution that contains hexafluorosilicic acid, and isolating a treated phosphor of formula I having improved color stability relative to an untreated phosphor of formula I $$A_x[MF_y]:Mn^{+4} \qquad (I)$$

wherein
A is Li, Na, K, Rb, Cs, $R_4$ or a combination thereof;
M is Si, Ge, Sn, Ti, Zr, Al, Ga, In, Sc, Y, La, Nb, Ta, Bi, Gd, or a combination thereof;
R is H, lower alkyl, or a combination thereof;
x is the absolute value of the charge of the $[MF_y]$ ion; and
y is 5, 6 or 7.

12 Claims, 3 Drawing Sheets

(51) Int. Cl.
 C09K 11/66 (2006.01)
 C09K 11/67 (2006.01)
 F21V 9/16 (2006.01)
 H01L 33/50 (2010.01)

(56) References Cited

U.S. PATENT DOCUMENTS

| | | | |
|---|---|---|---|
| 4,479,886 A | 10/1984 | Kasenga | |
| 6,103,296 A | 8/2000 | McSweeney | |
| 7,270,773 B2 | 9/2007 | Manivannan et al. | |
| 7,358,542 B2 | 4/2008 | Radkov et al. | |
| 7,422,703 B2 | 9/2008 | Yi et al. | |
| 7,497,973 B2 | 3/2009 | Radkov et al. | |
| 7,648,649 B2 | 1/2010 | Radkov et al. | |
| 7,847,309 B2 | 12/2010 | Radkov et al. | |
| 8,057,706 B1 * | 11/2011 | Setlur | C09K 11/02 252/301.4 F |
| 8,252,613 B1 * | 8/2012 | Lyons | C09K 11/617 438/45 |
| 8,362,685 B2 | 1/2013 | Masuda et al. | |
| 8,427,042 B2 | 4/2013 | Hata et al. | |
| 8,491,816 B2 | 7/2013 | Hong et al. | |
| 8,497,623 B2 | 7/2013 | Oguma et al. | |
| 8,593,062 B2 | 11/2013 | Murphy et al. | |
| 8,703,016 B2 | 4/2014 | Nammalwar et al. | |
| 8,710,487 B2 * | 4/2014 | Lyons | C09K 11/617 257/13 |
| 8,906,724 B2 * | 12/2014 | Murphy | H01L 33/502 438/13 |
| 2009/0001869 A1 | 1/2009 | Tanimoto et al. | |
| 2010/0013373 A1 * | 1/2010 | Hata | H01L 33/504 313/502 |
| 2010/0090585 A1 | 4/2010 | Seto et al. | |
| 2010/0091215 A1 | 4/2010 | Fukunaga et al. | |
| 2011/0069490 A1 | 3/2011 | Liu | |
| 2012/0256125 A1 | 10/2012 | Kaneyoshi et al. | |
| 2013/0241396 A1 | 9/2013 | Hiramatsu et al. | |
| 2013/0264937 A1 | 10/2013 | Sakuta et al. | |
| 2013/0271960 A1 | 10/2013 | Hong et al. | |

FOREIGN PATENT DOCUMENTS

| | | | | |
|---|---|---|---|---|
| EP | 1807354 B1 | | 11/2008 | |
| GB | 1360690 A | | 7/1974 | |
| JP | 2013014715 A | * | 1/2013 | |
| JP | 2013060506 A | | 4/2013 | |
| WO | 2009119486 A1 | | 10/2009 | |
| WO | 2011073951 A2 | | 6/2011 | |
| WO | 2013088313 A1 | | 6/2013 | |
| WO | WO 2013088313 A1 | * | 6/2013 | ............ H01L 33/502 |
| WO | 2013121355 A1 | | 8/2013 | |
| WO | 2013144919 A1 | | 10/2013 | |
| WO | 2013158929 A1 | | 10/2013 | |
| WO | 2014068440 A1 | | 5/2014 | |

OTHER PUBLICATIONS

Frayret et al., "Solubility of (NH4)2SiF6, K2SiF6 and Na2SiF6 in acidic solutions", Chemical Physics Letters, Aug. 2006, pp. 356-364, vol. 427, Issue 4.

Paulusz, "Efficient Mn(IV) Emission in Fluorine Coordination", Journal of The Electrochemical Society, Jul. 1973, pp. 942-947, vol. 120, Issue 7.

Liao et al.,"Synthesis of K2SiF6:Mn4+ Phosphor from SiO2 Powders via Redox Reaction in HF/KMnO4 Solution and Their Application in Warm-White LED", Journal of the American Ceramic Society, Wiley online library, Nov. 2013, vol. 96, Issue 11, pp. 3552-3556.

Hu et al., "Preparation and luminescent properties of (Ca1-x,Srx)S:Eu2+ red-emitting phosphor for white LED", Journal of Luminescence, ScienceDirect, Feb. 1, 2005,vol. 111, Issue 3, pp. 139-145.

Kasa et al.,"Red and Deep Red Emissions from Cubic K2SiF6:Mn4+ and Hexagonal K2MnF6 Synthesized in HF/KMnO4/KHF2/Si Solutions", Journal of The Electrochemical Society, ECS, 2012, vol. 159, issue 4, J89-J95.

Nammalwar et al., "Phosphor Materials and Related Devices", U.S. Appl. No. 14/348,244, filed Mar. 28, 2014.

Murphy et al., "Method and System for Storage of Perishable Items", U.S. Appl. No. 13/665,514, filed Oct. 31, 2012.

Brewster et al., "Phosphor Assembly for Light Emitting Devices", U.S. Appl. No. 13/875,534, filed May 2, 2013.

Murphy, "Processes for Preparing Color Stable Manganese-Doped Phosphors", U.S. Appl. No. 61/868,633, filed Aug. 22, 2013.

Setlur et al., "LED Package With Red-Emitting Phosphors", U.S. Appl. No. 14/073,141, filed Nov. 6, 2013.

Murphy et al., "Processes for Preparing Color Stable Manganese-Doped Complex Fluoride Phosphors", U.S. Appl. No. 61/915,927, filed Dec. 13, 2013.

Murphy et al., "Red-Emtting Phosphors and Associated Devices", U.S. Appl. No. 14/303,020, filed Jun. 12, 2014.

Setlur et al., "Color Stable Red-Emitting Phosphors", U.S. Appl. No. 14/302,823, filed Jun. 12, 2014.

Setlur et al., "LED Package With Red-Emitting Phosphors", U.S. Appl. No. 14/304,098, filed Jun. 13, 2014.

Garcia et al., "Color Stable Red-Emitting Phosphors",U.S. Appl. No. 14/302,907, filed Jun. 12, 2014.

Bera et al., "Optimization of the Yellow Phosphor Concentration and Layer Thickness for Down-Conversion of Blue to White Light", Journal of Display Technology, pp. 645-651, vol. 6, No. 12, Dec. 2010.

Murphy et al., "Color Stable Red-Emitting Phosphors", U.S. Appl. No. 14/208,592, filed Mar. 13, 2014.

* cited by examiner

PROCESSES FOR PREPARING COLOR STABLE MANGANESE-DOPED PHOSPHORS

CROSS-REFERENCE TO RELATED APPLICATIONS

This application claims priority to U.S. Provisional Patent Application No. 61/868,633, entitled "Processes for Preparing Color Stable Manganese-Doped Phosphors", filed Aug. 22, 2013, which is herein incorporated in its entirety by reference for all purposes.

BACKGROUND

Red-emitting phosphors based on complex fluoride materials activated by Mn4+ can be utilized in combination with yellow/green emitting phosphors such as YAG:Ce or other garnet compositions to achieve warm white light (CCTs<5000 K on the blackbody locus, color rendering index (CRI)>80) from a blue LED, equivalent to that produced by current fluorescent, incandescent and halogen lamps. These materials absorb blue light strongly and efficiently emit between about 610-635 nm with little deep red/NIR emission. Therefore, luminous efficacy is maximized compared to red phosphors that have significant emission in the deeper red where eye sensitivity is poor. Quantum efficiency can exceed 85% under blue (440-460 nm) excitation.

While the efficacy and CRI of lighting systems using $Mn^{4+}$ doped fluoride hosts can be quite high, many of these materials exhibit some instability in high temperature, high humidity environments and this may limit their use in commercial systems requiring long term stability under operating conditions. U.S. Pat. No. 8,252,613 describes a process that can reduce this degradation by post-synthesis treatment with an aqueous hydrofluoric acid (HF) solution of a hexafluorosilicate salt. However, toxicity of HF is a significant consideration, and alternatives that can maintain the improvement in stability of the materials while reducing the amount or concentration of HF in the treatment solution are desirable.

BRIEF DESCRIPTION

Accordingly, in one aspect, the present invention relates to low-HF or HF-free processes for improving color stability of a $Mn^{+4}$ doped phosphor of formula I, $$A_x[MF_y]:Mn^{+4} \qquad (I)$$

wherein
A is Li, Na, K, Rb, Cs, $R_4$ or a combination thereof;
M is Si, Ge, Sn, Ti, Zr, Al, Ga, In, Sc, Y, La, Nb, Ta, Bi, Gd, or a combination thereof;
R is H, lower alkyl, or a combination thereof;
x is the absolute value of the charge of the $[MF_y]$ ion; and
y is 5, 6 or 7.
The processes include contacting the phosphor of formula I with a solution that contains hexafluorosilicic acid, and isolating a treated phosphor of formula I having improved color stability relative to an untreated phosphor of formula I.

In another aspect, the present invention relates to color-stable $Mn^{+4}$ doped phosphors prepared by processes according to the present invention, and phosphor blends that contain the color-stable $Mn^{+4}$ doped phosphors.

In yet another aspect, the present invention relates to a lighting apparatus capable of emitting white light. The lighting apparatus includes a semiconductor light source; and a phosphor composition radiationally coupled to the light source, and which includes a color stable $Mn^{+4}$ doped phosphor of formula I prepared by a process comprising contacting the phosphor of formula I with a solution comprising hexafluorosilicic acid, and isolating a treated phosphor of formula I having improved color stability relative to an untreated phosphor of formula I.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
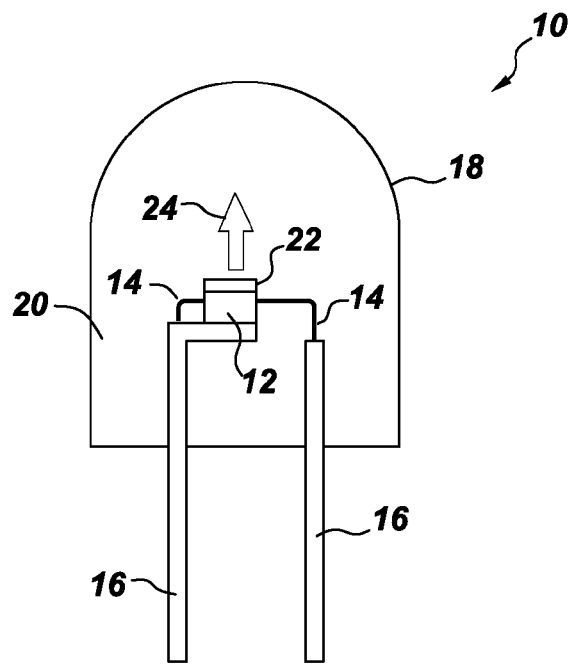
FIG. 1 is a schematic cross-sectional view of a lighting apparatus in accordance with one embodiment of the invention.

In one aspect, the present invention relates to low-HF or HF-free processes for improving color stability of a $Mn^{+4}$ doped phosphor of formula I. The processes include contacting the phosphor of formula I with a solution that contains hexafluorosilicic acid, and isolating a treated phosphor of formula I having improved color stability relative to an untreated phosphor of formula I. The solution additionally contains water, and may contain a salt of formula $A_x[MF_y]$, for example, $K_2SiF_6$. In some embodiments, the solution is HF-free, that is, contains less than 1% HF. In other embodiments, the solution is low-HF in comparison to the process of U.S. Pat. No. 8,252,613, as some of the HF of that process is replaced by hexafluorosilicic acid. The amount of HF replaced ranges from about 25% to about 100% by weight percent. Where the solution contains HF, it may also contain the salt of formula $A_x[MF_y]$.

$Mn^{+4}$ doped phosphors of formula I are disclosed in U.S. Pat. No. 3,576,756, U.S. Pat. No. 7,497,973 and U.S. Pat. No. 7,648,649, and GB 1360690. The phosphors of formula I may be described as $Mn^{4+}$-activated complex fluoride compounds or materials, or more specifically, $Mn^{4+}$-activated complex metal or metalloid fluoride compounds or materials. The compounds include a coordination compound containing at least one coordination center surrounded by fluoride ions acting as ligands, and charge-compensated by counter ions as necessary. In one example, $K_2SiF_6:Mn^{4+}$, the coordination center is Si and the counterion is K. The $Mn^{4+}$ activator ion substitutes for some of the atoms of the centers of the host lattice, Si in the example of $K_2SiF_6:Mn^{4+}$, and also acts as a coordination center. The host lattice (including the counter ions) may further modify the excitation and emission properties of the activator ion.

The coordination center of the phosphor of formula I, that is, M in formula I, may be Si, Ge, Sn, Ti, Zr, Al, Ga, In, Sc, Y, La, Nb, Ta, Bi, Gd, or a combination thereof. Si, In particular embodiments, the coordination center may be Ge, Sn, Ti, Zr, or a combination thereof. More particularly, the coordination center may be Si, Ge, Ti, or a combination thereof, and the counterion, or A in formula I, is Na, K, Rb, Cs, or a combination thereof, and y is 6. Examples of phosphors of formula I include $K_2[SiF_6]:Mn^{4+}$, $K_2[TiF_6]:Mn^{4+}$, $K_2[SnF_6]:Mn^{4+}$, $Cs_2[TiF_6]$, $Rb_2[TiF_6]$, $Cs_2[SiF_6]$, $Rb_2[SiF_6]$, $Na_2[TiF_6]$: $Mn^{4+}$, $Na_2[ZrF_6]:Mn^{4+}$, $K_3[ZrF_7]:Mn^{4+}$, $K_3[BiF_6]:Mn^{4+}$, $K_3[YF_6]:Mn^{4+}$, $K_3[LaF_6]:Mn^{4+}$, $K_3[GdF_6]:Mn^{4+}$, $K_3[NbF_7]:Mn^{4+}$, $K_3[TaF_7]:Mn^{4+}$. In particular embodiments, the phosphor of formula I is $K_2SiF_6:Mn^{4+}$.

The amount of manganese in the $Mn^{4+}$ doped phosphors typically ranges from about 0.4 weight % to about 0.9 weight %, based on total weight of the color stable phosphor In particular embodiments, where the phosphor is $K_2SiF_6:Mn^{4+}$, the amount of Mn ranges from about 0.53 wt % to about 0.76 wt %, more particularly from about 0.65 wt % to about 0.7 wt %.

In the processes of the present invention, temperature at which the phosphor in particulate form is contacted with the solution is not critical, and may range from about 20° C. to about 70° C., although higher and lower temperatures may be used if desired. Likewise, the period of time required to produce a color stable phosphor typically ranges from about one minute to about five hours, particularly from about five minutes to about one hour, but other times may also be used.

In addition to the treatment with aqueous acid, the phosphor of formula I may be also annealed, or subjected to an elevated temperature, while in contact with an atmosphere containing a fluorine-containing oxidizing agent. The phosphor may be annealed before or after the treatment; and may be treated multiple times, if desired. Where the phosphor is annealed before the treatment, impurities introduced during the annealing process may be removed by the treatment. The fluorine-containing oxidizing agent may be $F_2$, HF, $BrF_5$, $NH_4HF_2$, $NH_4F$, KF, $AlF_3$, $SbF_5$, $ClF_3$, $BrF_3SbF_5$, KrF, $XeF_2$, $XeF_4$, $NF_3$ or a combination thereof, particularly $F_2$. The amount of oxidizing agent in the atmosphere may be varied to obtain the color stable phosphor, particularly in conjunction with variation of time and temperature. Where the fluorine-containing oxidizing agent is $F_2$, the atmosphere may include at least 0.5% $F_2$, although a lower concentration may be effective in some embodiments. In particular the atmosphere may include at least 5% $F_2$, more particularly, at least 20% $F_2$, and even more particularly, at least 35% $F_2$. The atmosphere may additionally include nitrogen, helium, neon, argon, krypton, xenon, in any combination with fluorine gas. In particular embodiments, the atmosphere is composed of about 20% $F_2$ and about 80% nitrogen.

The temperature at which the phosphor is contacted with the fluorine-containing oxidizing agent may range from about 200° C. to about 530° C., particularly from about 350° C. to about 500° C. during contact. In various embodiments of the present invention, the temperature is at least 100° C., particularly about 400° C., and more particularly about 475° C. The phosphor is contacted with the oxidizing agent for a period of time sufficient to convert it to a color stable phosphor. Time and temperature are interrelated, and may be adjusted together, for example, increasing time while reducing temperature, or increasing temperature while reducing time.

A lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self supported electrodes and the lead frame may be omitted. The leads 14 provide current to LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $I+j+k=1$) having an emission wavelength greater than about 250 nm and less than about 550 nm. In particular embodiments, the chip is a near-uv or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and phosphor blend 22, which contains a $Mn^{+4}$ doped phosphor according to the present invention. Alternately, the lamp may 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame. In some embodiments, the LED chip 12 is mounted in a reflective cup (not shown). The cup may be made from or coated with a reflective material, such as alumina, titania, or other dielectric powder known in the art, particularly alumina.

Lighting apparatus 10 includes phosphor blend 22, radiationally coupled to the LED chip 12. Radiationally coupled means that the elements are associated with each other so radiation from one is transmitted to the other. Phosphor blend 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of phosphor blend 22 and LED 12. Thus, phosphor blend 22 may be coated over or directly on the light emitting surface of the LED chip 12 by coating and drying the phosphor suspension over the LED chip 12. Both the shell 18 and the encapsulant 20 should be transparent to allow white light 24 to be transmitted through those elements. Although not intended to be limiting, in some embodiments, the median particle size of the phosphor composition ranges from about 1 to about 25 microns, particularly from about 15 to about 20 microns.

In other embodiments, phosphor blend 22 is interspersed within the encapsulant material 20, instead of being formed directly on the LED chip 12. The phosphor (in the form of a powder) may be interspersed within a single region of the encapsulant material 20 or, more preferably, throughout the entire volume of the encapsulant material. Blue light emitted by the LED chip 12 mixes with the light emitted by phosphor blend 22, and the mixed light appears as white light. If the phosphor is to be interspersed within the material of encapsulant 20, then a phosphor powder may be added to a polymer precursor, loaded around the LED chip 12, and then the polymer precursor may be cured to solidify the polymer material. Other known phosphor interspersion methods may also be used, such as transfer loading.

In yet another embodiment, phosphor blend 22 is coated onto a surface of the shell 18, instead of being formed over the LED chip 12. The phosphor composition is preferably coated on the inside surface of the shell 18, although the phosphor may be coated on the outside surface of the shell, if desired. Phosphor blend 22 may be coated on the entire surface of the shell or only a top portion of the surface of the shell. The UV/blue light emitted by the LED chip 12 mixes with the light emitted by phosphor blend 22, and the mixed light appears as white light. Of course, the phosphor may be located in any two or all three locations or in any other suitable location, such as separately from the shell or integrated into the LED.

Figure 2:
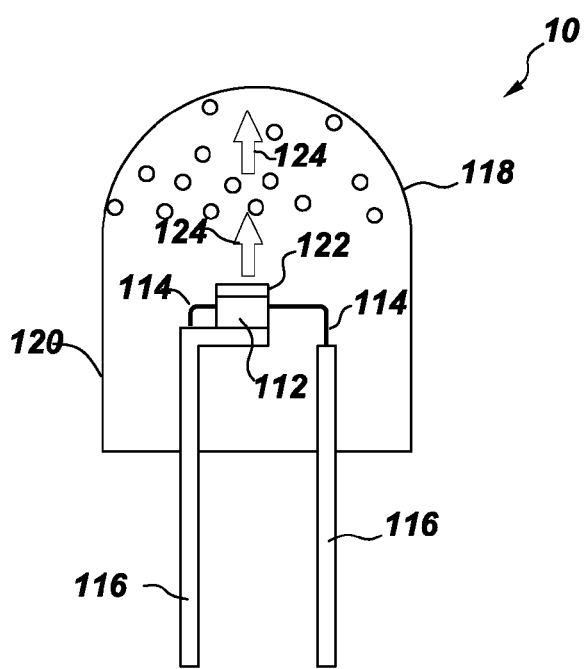
FIG. 2 is a schematic cross-sectional view of a lighting apparatus in accordance with another embodiment of the invention.

FIG. 2 illustrates a second structure of the system according to the present invention. Corresponding numbers from FIGS. 1-4 (e.g. 12 in FIG. 1 and 112 in FIG. 2) relate to corresponding structures in each of the figures, unless otherwise stated. The structure of the embodiment of FIG. 2 is similar to that of FIG. 1, except that the phosphor material 122 is interspersed within the encapsulant material 120, instead of being formed directly on the LED chip 112. The phosphor (in the form of a powder) may be interspersed within a single region of the encapsulant material or, more preferably, throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer precursor may then be cured to solidify the polymer. Other known phosphor interspersion methods may also be used, such as transfer molding.

Figure 3:
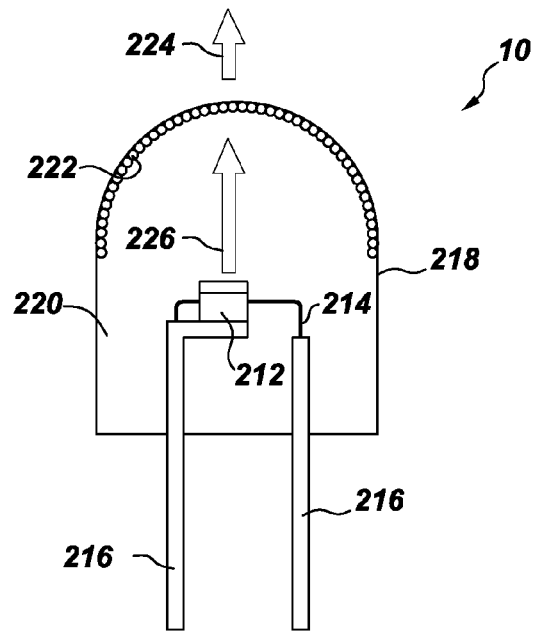
FIG. 3 is a schematic cross-sectional view of a lighting apparatus in accordance with yet another embodiment of the invention.

FIG. 3 illustrates a third possible structure of the system according to the present invention. The structure of the embodiment shown in FIG. 3 is similar to that of FIG. 1, except that the phosphor material 222 is coated onto a surface of the envelope 218, instead of being formed over the LED chip 212. The phosphor material 222 is preferably coated on the inside surface of the envelope 218, although the phosphor may be coated on the outside surface of the envelope, if desired. The phosphor 222 may be coated on the entire surface of the envelope, or only a top portion of the surface of the envelope. The radiation 226 emitted by the LED chip 212 mixes with the light emitted by the phosphor 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp 10 {as exemplified in FIG. 1) may also include a plurality of scattering particles (not shown), which are embedded in the encapsulant material. The scattering particles may comprise, for example, alumina or titania. The scattering particles effectively scatter the directional light emitted from the LED chip, preferably with a negligible amount of absorption.

Figure 4:
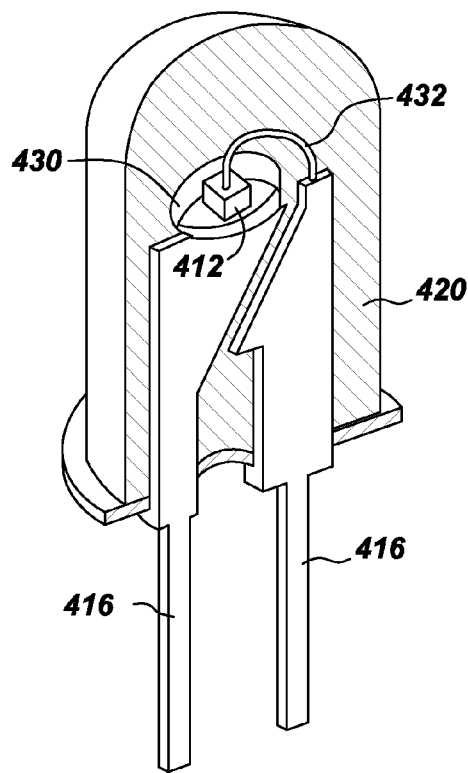
FIG. 4 is a cutaway side perspective view of a lighting apparatus in accordance with one embodiment of the invention.

As shown in a fourth structure in FIG. 4, the LED chip 412 may be mounted in a reflective cup 430. The cup 430 may be made from or coated with a reflective material, such as alumina, titania, or other dielectric powders known in the art, particularly alumina. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
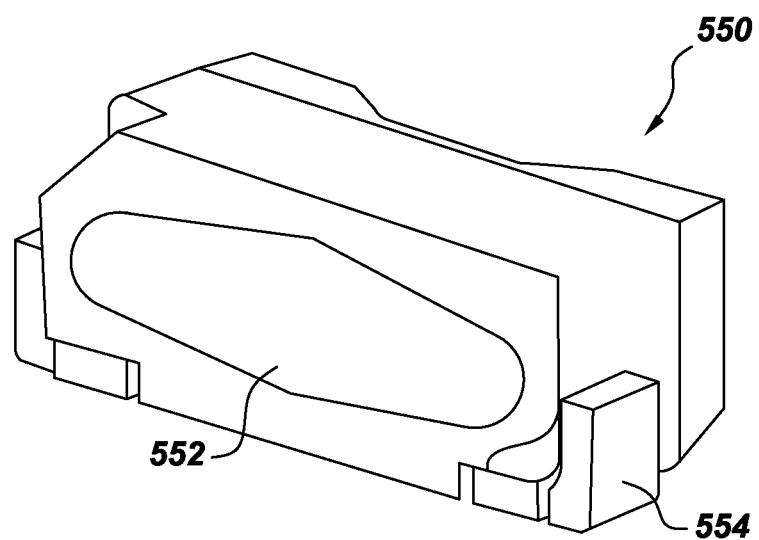
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. The SMD type light emitting diodes 550 can be made by disposing LEDs that have been formed beforehand by flow soldering or the like on a glass epoxy substrate, whereon an electrically conductive pattern has been formed and covering the LED with the window 552. An SMD package may comprise an LED chip as defined above, and a phosphor material that is excited by the light emitted from the LED chip.

When used with an LED emitting at from 350 to 550 nm and one or more other appropriate phosphors, the resulting lighting system will produce a light having a white color, the characteristics of which will be discussed in more detail below. Lamp 10 may also include scattering particles (not shown), which are embedded in the encapsulant material. The scattering particles may comprise, for example, alumina or titania. The scattering particles effectively scatter the directional light emitted from the LED chip, preferably with a negligible amount of absorption.

In addition to the color stable $Mn^{+4}$ doped phosphor, phosphor blend 22 may include one or more other phosphors. When used in a lighting apparatus in combination with a blue or near UV LED emitting radiation in the range of about 250 to 550 nm, the resultant light emitted by the assembly will be a white light. Other phosphors such as green, blue, orange, or other color phosphors may be used in the blend to customize the white color of the resulting light and produce higher CRI sources. When used in conjunction with a LED chip emitting at from, e.g., 250 to 550 nm, the lighting apparatus preferably includes a blue phosphor for converting some, and preferably all, of the LED radiation to blue light, which in turn can then be efficiently converted by the color stable $Mn^{+4}$ phosphors and phosphor blends of the present invention. Suitable phosphors for use in phosphor blends according to the present invention include, but are not limited to, $(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$; $(Sr,Ca)_{10}(PO_4)_6*vB_2O_3:Eu^{2+}$ (wherein $0<v\leq1$); $Sr_2Si_3O_8*2SrCl_2:Eu^{2+}$; $(Ca,Sr,Ba)_3MgSi_2O_8:Eu^{2+},Mn^{2+}$; $BaAl_8O_{13}:Eu^{2+}$; $2SrO*0.84P_2O_5.0.16B_2O_3:Eu^{2+}$; $(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$; $ZnS:Cu^+,Cl^-$; $ZnS:Cu^+,Al^{3+}$; $ZnS:Ag^+,Cl^-$; $ZnS:Ag^+,Al^{3+}$; $(Ba,Sr,Ca)_2Si_{1-\xi}O_{4-2\xi}:Eu^{2+}$ (wherein $0\leq\xi\leq0.2$); $(Ba,Sr,Ca)_2(Mg,Zn)Si_2O_7:Eu^{2+}$; $(Sr,Ca,$ Ba)(Al,Ga,In)$_2$S$_4$:Eu$^{2+}$; (Y,Gd,Tb,La,Sm,Pr,Lu)$_3$(Al,Ga)$_{5-\alpha}$O$_{12-3/2\alpha}$:Ce$^{3+}$ (wherein $0 \leq \alpha \leq 0.5$); (Ca,Sr)$_8$(Mg,Zn)(SiO$_4$)$_4$Cl$_2$:Eu$^{2+}$,Mn$^{2+}$; Na$_2$Gd$_2$B$_2$O$_7$:Ce$^{3+}$,Tb$^{3+}$; (Sr,Ca,Ba,Mg,Zn)$_2$P$_2$O$_7$:Eu$^{2+}$,Mn$^{2+}$; (Gd,Y,Lu,La)$_2$O$_3$:Eu$^{3+}$,Bi$^{3+}$; (Gd,Y,Lu,La)$_2$O$_2$S:Eu$^{3+}$,Bi$^{3+}$; (Gd,Y,Lu,La)VO$_4$:Eu$^{3+}$,Bi$^{3+}$; (Ca,Sr)S:Eu$^{2+}$,Ce$^{3+}$; SrY$_2$S$_4$:Eu$^{2+}$; CaLa$_2$S$_4$:Ce$^{3+}$; (Ba,Sr,Ca)MgP$_2$O$_7$:Eu$^{2+}$,Mn$^{2+}$; (Y,Lu)$_2$WO$_6$:Eu$^{3+}$,Mo$^{6+}$; (Ba,Sr,Ca)$_\beta$Si$_\gamma$N$_\mu$:Eu$^{2+}$ (wherein $2\beta+4\gamma=3\mu$); Ca$_3$(SiO$_4$)Cl$_2$:Eu$^{2+}$; (Lu,Sc,Y,Tb)$_{2-u-v}$Ce$_v$Ca$_{1+u}$Li$_w$Mg$_{2-w}$P$_w$(Si,Ge)$_{3-w}$O$_{12-u/2}$ (where $-0.5 \leq u \leq 1$, $0 < v \leq 0.1$, and $0 \leq w \leq 0.2$); (Y,Lu,Gd)$_{2-\phi}$Ca$_\phi$Si$_4$N$_{6+\phi}$C$_{1-\phi}$:Ce$^{3+}$, (wherein $0 \leq \phi \leq 0.5$); (Lu,Ca,Li,Mg,Y) alpha-SiAlON doped with Eu$^{2+}$ and/or Ce$^{3+}$; (Ca,Sr,Ba)SiO$_2$N$_2$:Eu$^{2+}$,Ce$^{3+}$; 3.5MgO*0.5MgF$_2$*GeO$_2$:Mn$^{4+}$; Ca$_{1-c-f}$Ce$_c$Eu$_f$Al$_{1+c}$Si$_{1-c}$N$_3$, (where $0 < c \leq 0.2$, $0 \leq f \leq 0.2$); Ca$_{1-h-r}$Ce$_h$Eu$_r$Al$_{1-h}$(Mg,Zn)$_h$SiN$_3$, (where $0 < h \leq 0.2$, $0 \leq r \leq 0.2$); Ca$_{1-s-t}$Ce$_s$(Li,Na)$_s$Eu$_t$AlSiN$_3$, (where $0 \leq s \leq 0.2$, $0 \leq f \leq 0.2$, s+t>0); and Ca$_{1-o-\chi-\phi}$Ce$_o$(Li,Na)$_\chi$Eu$_\phi$Al$_{1+o-\chi}$Si$_{1+o+\chi}$N$_3$, (where $0 \leq o \leq 0.2$, $0 < \chi \leq 0.4$, $0 \leq \phi \leq 0.2$)

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.30 to about 0.55, and a y value in the range of about 0.30 to about 0.55. As stated, however, the exact identity and amounts of each phosphor in the phosphor composition can be varied according to the needs of the end user.

When combined with a LED emitting at from 350-550 nm and, optionally, one or more additional phosphors, the use of a phosphor according to the present invention allows for a white LED device having a higher CRI value and lower CCT as compared to a cerium doped terbium aluminum garnet (TAG) based lighting device. LED devices having CCT values from about 2500 to about 10000, preferably from 2500 to 4500, and high CRI values from about 70 to 95 can be made. This allows for an increased ccx coordinate and a reduced ccy coordinate on the CIE color chromaticity diagram for the LED device, resulting in a "warmer" color LED.

The color stable Mn$^{+4}$ doped phosphors of the present invention may be used in applications other than those described above. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are merely exemplary and not limiting.

EXAMPLES

General Procedures

Annealing Procedure

The PFS phosphor was placed in a furnace chamber. The furnace chamber was evacuated using a mechanical pump and purged multiple times with nitrogen and nitrogen, fluorine mixtures. After several pump and purge cycles, the furnace chamber was filled with an atmosphere containing 20% fluorine gas and 80% nitrogen gas to a pressure of about 1 atmosphere. The chamber was then heated to the desired anneal temperature. After holding for about 8 hours, the chamber was cooled to room temperature. The fluorine nitrogen mixture was evacuated, the chamber was filled and purged several times with nitrogen to ensure the complete removal of fluorine gas before opening the chamber.

Preparation of Treatment Solutions

Aqueous solutions containing HF were prepared using 48% HF (w/w) and solutions containing H$_2$SiF$_6$ were prepared using 35% H$_2$SiF$_6$ (w/w). Where K$_2$SiF$_6$ was used, it was added to the solution which was stirred for 30 minutes after the addition, then gravity filtered through a 2.7 micron pore size filter paper to remove undissolved K$_2$SiF$_6$.

Aqueous Solution Treatment

The phosphor (3 g.) was slowly added to the solution (26 ml), and the mixture was stirred for 20 minutes. The phosphor was allowed to settle for 1 minute, then the supernatant was decanted and the treated phosphor was filtered, rinsed with acetone 3 times, dried under vacuum for 3 hours and sifted.

High Temperature High Humidity (HHTH) Stability Testing

Samples for high temperature, high humidity (HTHH) treatment were made by mixing phosphor powders into a two-part methyl silicone binder (RTV-615, Momentive Performance Materials) in a ratio of 0.9 g phosphor to 0.825 g silicone (parts A+B). The phosphor/silicone mixture was then poured into aluminum sample holders and cured at 90° C. for 20 minutes. Control samples were stored under nitrogen, and samples for exposure to HTHH conditions were placed into a 85° C./85% RH controlled atmosphere chamber. These HTHH samples were removed after 300 hours and their luminescence intensity under 450 nm excitation compared to that of the control samples.

High Light Flux Conditions (Laser Damage) Stability Testing

A laser diode emitting at 446 nm was coupled to an optical fiber with a collimator at its other end. The power output was 310 mW and the beam diameter at the sample was 700 microns. This is equivalent to a flux of 80 W/cm$^2$ on the sample surface. The spectral power distribution (SPD) spectrum that is a combination of the scattered radiation from the laser and the emission from the excited phosphor is collected with a 1 meter (diameter) integrating sphere and the data processed with the spectrometer software (Specwin). At intervals of two minutes, the integrated power from the laser and the phosphor emission were recorded (by integrating the SPD from 400 nm to 500 nm and 550 nm to 700 nm respectively). The first 90 minutes of the measurement are discarded to avoid effects due to the thermal stabilization of the laser. The percentage of intensity loss due to laser damage is calculated as follows:

$$\text{Intensity loss }(\%) = 100 \frac{(\text{Power} - \text{Initial power})}{\text{Initial power}} = \text{Laser Damage}$$

While only the emitter power from the phosphor is plotted, the integrated power from the laser emission as well as its peak position was monitored to ensure that the laser remained stable (variations of less than 1%) during the experiment.

Comparative Examples 1-4

Control materials that were not exposed to the aqueous treatment included the as-synthesized PFS phosphor, that is, material that was not heat treated (Comparative Example 1) and the PFS phosphor after F$_2$ annealing (Comparative Example 3). The same materials were also treated with the HF solution containing K$_2$SiF$_6$ as described in U.S. Pat. No. 8,252,613 (Comparative Examples 2 and 4).

Examples 1-7

In Examples 1-5, the as-synthesized PFS phosphor (without heat treatment) were treated with aqueous solutions as shown in Table 1. In Examples 6 and 7, the PFS phosphor was annealed under a fluorine atmosphere before treatment with the hexafluorosilicic acid solutions shown in Table 1.

TABLE 1

|  | HF, ml | $H_2SiF_6$, ml | $K_2SiF_6$, g |
|---|---|---|---|
| Comparative Example No. | | | |
| 1 | NA | NA | NA |
| 2 | 26 | 0 | 1.4 |
| Example No. | | | |
| 1 | 20 | 6 | 1.4 |
| 2 | 13 | 13 | 1.4 |
| 3 | 6 | 20 | 1.4 |
| 4 | 0 | 26 | 1.4 |
| 5 | 0 | 26 | 0 |
| Comparative Example No. | | | |
| 3 | NA | NA | NA |
| 4 | 26 | | 1.4 |
| Example No. | | | |
| 6 | 0 | 26 | 1.4 |
| 7 | 0 | 26 | 0 |

The phosphors of Examples 1-7 and Comparative Examples 1-4 were subjected to HHTH conditions and evaluated for laser damage. Results are shown in Table 2. For these experiments, plaque measurements of the powder had a standard deviation of 0.6% for absorbance measurements (Abs.), 1.7% for quantum efficiency measurements (QE) and 2% for high temperature, high humidity (HTHH) measurements. The standard deviation for measuring the quantum efficiency and laser damage of PFS when mixed in a silicone and measured in an integrating sphere (tape QE) are less than 0.5%.

TABLE 2

| Ex. no. | Comp. ex. no | Absorbance | QE | HTHH | Tape QE | Laser damage | Treatment |
|---|---|---|---|---|---|---|---|
|  | 1 | 72 | 100 | 92 | 100 | 8 | None |
|  | 2 | 71 | 100 | 99 | 102 | 7.2 | 100% HF |
| 1 |  | 71 | 98 | 100 | X | X | |
| 2 |  | 71 | 98 | 98 | X | X | |
| 3 |  | 69 | 99 | 100 | X | X | |
| 4 |  | 70 | 98 | 97 | 101 | 6.8 | No HF |
| 5 |  | 70 | 99 | 98 | X | X | No $K_2SiF_6$ |
|  | 3 | 67 | 100 | X | 100 | 0.6 | None |
|  | 4 | 65 | 100 | X | 100 | 0.6 | 100% HF |
| 6 |  | 64 | 105 | X | 101 | 0.3 | No HF |
| 7 |  | 66 | 104 | X | 102 | 0.3 | No $K_2SiF_6$ |

All aqueous treatments were effective in preventing reduction in intensity after exposure to HHTH or high light flux condition compared to untreated controls. Comparative Example 1 illustrates the loss of properties of an untreated phosphor stability testing. QE and intensity after stability testing of the samples of Examples 1-5 was equivalent to or better than that of Comparative Example 2, which was treated with a solution containing HF and $K_2SiF_6$, and no hexafluorosilicic acid. Likewise, performance of the samples of Examples 6 and 7 were equivalent to or better than that of Comparative Example 4. However, samples that were treated with solutions containing no HF produced phosphors had the best balance of properties after aging. Examples 4, 6 and 7 showed significant reduction in laser damage, while maintaining HHTH performance and maintaining or improving QE.

No significant change in particle size was measured for samples produced using any of the treatment processes. Although the particle size did not change, the sample of Example 3 had a tap bulk density that was 1.6× that of Comparative Example 2, indicating that the $H_2SiF_6$ treated material is less agglomerated than the HF treated material. The slight decrease in absorbance measured for the treated samples indicates that the manganese content of these samples decreased after treatment.

Example 8

X-Ray Photoelectron Spectroscopy

Table 3 shows the results of XPS measurements, which provide elemental analysis of the surface of the powder and has a detection limit of about 0.1 atomic %. In agreement with the plaque absorbance measurements, XPS provides further evidence that the surface [Mn] decreases upon treatment to the detection limits of the measurement system. In addition, surface carbon and oxygen are also reduced upon treatment.

TABLE 3

|  | % C | % O | % F | % K | % Si | % Mn |
|---|---|---|---|---|---|---|
| Comp. Ex. 1 | 12.8 | 1.4 | 52.1 | 20.8 | 12.6 | 0.21 |
| Ex. No. 4 | 1.8 | 0.6 | 61.5 | 23.0 | 13.0 | 0.06 |
| Ex. No. 3 | 2.0 | 0.6 | 62.1 | 22.4 | 12.7 | 0.07 |
| Comp. Ex. 2 | 6.0 | 1.0 | 58.3 | 21.6 | 13.1 | 0.03 |

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A process for improving color stability of a $Mn^{+4}$ doped phosphor of formula I, $$A_x[MF_y]:Mn^{+4} \tag{I}$$

the process comprising treating the phosphor of formula I with a manganese free solution comprising hexafluorosilicic acid; and
isolating a treated phosphor having improved color stability relative to an untreated phosphor;
wherein
A is Li, Na, K, Rb, Cs, $R_4$ or a combination thereof;
M is Si, Ge, Sn, Ti, Zr, Al, Ga, In, Sc, Y, La, Nb, Ta, Bi, Gd, or a combination thereof;
R is H, lower alkyl, or a combination thereof;
x is 1, 2, or 3, and is the absolute value of the charge of the $[MF_y]$ ion; and
y is 5, 6 or 7.

2. A process according to claim 1, wherein the solution additionally comprises a salt of formula $A_x[MF_y]$.

3. A process according to claim 1, wherein the solution is free of hydrofluoric acid.

4. A process according to claim 1, wherein the solution additionally comprises hydrofluoric acid.

5. A process according to claim 1, additionally comprising exposing the phosphor to fluorine gas at elevated temperature.

6. A process according to claim 1, wherein M is Si, Ge, Sn, Ti, Zr, or a combination thereof.

7. A process according to claim 1, wherein the $Mn^{+4}$ doped phosphor is $K_2SiF_6:Mn^{+4}$.

8. A process for improving color stability of a complex fluoride compound of formula $K_2SiF_6:Mn^{+4}$, the process comprising treating the phosphor with a manganese free solution comprising hexafluorosilicic acid; and isolating a treated phosphor formula $K_2SiF_6:Mn^{+4}$ having improved color stability relative to an untreated phosphor formula $K_2SiF_6:Mn^{+4}$.

9. A process according to claim 8, wherein the solution additionally comprises $K_2SiF_6$.

10. A process according to claim 8, wherein the solution is free of hydrofluoric acid.

11. A process according to claim 8, wherein the solution additionally comprises hydrofluoric acid.

12. A process according to claim 8, additionally comprising exposing the phosphor to fluorine gas at elevated temperature.

\* \* \* \* \*